United States Patent [19]

Roberts

[11] Patent Number: 5,218,222

[45] Date of Patent: Jun. 8, 1993

[54] OUTPUT ESD PROTECTION CIRCUIT

[75] Inventor: Gregory N. Roberts, Boise, Id.

[73] Assignee: Micron Semiconductor, Inc., Boise, Id.

[21] Appl. No.: 946,196

[22] Filed: Sep. 16, 1992

[51] Int. Cl.$^5$ ................. H01L 29/06; H01L 29/78
[52] U.S. Cl. ................................ 257/362; 257/363
[58] Field of Search ......................... 257/355-363

[56] References Cited

U.S. PATENT DOCUMENTS

| | | | |
|---|---|---|---|
| 4,733,285 | 3/1988 | Ishioka et al. | 257/359 |
| 4,819,047 | 4/1989 | Gilfeather et al. | 257/378 |
| 5,072,271 | 12/1991 | Shimizu et al. | 257/363 |
| 5,181,092 | 1/1993 | Atsumi | 257/362 |

OTHER PUBLICATIONS

"Output ESD Protection Techniques for Advanced CMOS Proceedings" Duvvury, et al., 1988 EOS/ESD Symposium Proceedings, pp. 206-211.

"ESD Phenomena and Protection in CMOS Output Buffers" Duvvury, et al., 1987 IEEE/IRPS, pp. 174-180.

"Improving the ESD Failure Threshold of Silicided nMOS Output Transistors by Ensuring Uniform Current Flow", Polgreen et al., 1989 EOS/ESD Symposium Proceedings, pp. 167-174.

*Primary Examiner*—Gene M. Munson
*Attorney, Agent, or Firm*—David J. Paul

[57] ABSTRACT

The basic component of the output ESD protection circuit of the present invention comprises a low resistance connected in series between an output pad and conventional active output pad pullup and pulldown drivers. In a preferred embodiment, a polysilicon resistor is connected in series between an output pad and a metal bus. On the metal bus, a lateral bipolar device is connected in parallel to an n-channel pulldown at an output node and a common potential (conventionally labeled as $V_{SS}$). The pullup device is also an active n-channel pullup device connected between an operating potential (conventionally labeled as $V_{CC}$) and the output node. Both drains of the two n-channel devices have n-well underneath the n+ diffusion in the area where metal contacts are formed to thereby prevent metal spiking to the substrate during an ESD event. This circuitry combination provides ESD protection equal to or greater than the voltage range of +8000/−2000 V for the HBM response (the Mil. Std. human body model [HBM] test model) as well as protection equal to or greater than the voltage range of +900/−700 V for the MM EIAJ response (the EIAJ machine model [MM] test model). The concept of using a low resistance between a pad and associated active devices (i.e., ESD protection circuitry) will work in combination with other ESD protection circuitry layouts and work equally well for input pad ESD protection.

18 Claims, 4 Drawing Sheets

OUTPUT ESD PROTECTION CIRCUIT

FIELD OF THE INVENTION

This invention relates generally to electrostatic discharge (ESD) protection circuits for CMOS semiconductor devices and in particular to a specific output ESD protection circuit fabrication layout on a silicon substrate.

BACKGROUND OF THE INVENTION

Increasing pin counts, as well as faster circuit speeds, have compounded the need for reliable ESD protection in integrated circuits (ICs). Input/output signals to a complimentary metal oxide semiconductor (CMOS) circuit are typically fed to input/output pads which are connected to the gates of metal oxide semiconductor (MOS) transistors. If high static discharge voltage is accidently applied to any of the input/output pins of an IC, the input/output transistor's gate insulator and the contacts between the pad and the underlying active area are vulnerable to damage if adequate ESD protection is not present. Therefore, all pins of MOS ICs must be ESD protected to prevent any harmful static discharge voltages from damaging the IC.

Four main types of ESD protection circuits have been implemented in IC design which are intended to provide a current path to ground to absorb the high static discharge voltage. These four main ESD protection circuits include: 1) diode breakdown, 2) node-to-node punchthrough, 3) gate-field-induced breakdown, and 4) parasitic pnpn diode latchup.

Operation and construction of each of the four main types of ESD protection circuits have been described in various publications, such as the textbook "SILICON PROCESSING FOR THE VLSI ERA"—VOLUME II, 1990, pp. 442-446 and therefore are not described further herein.

Also, an output ESD protection circuit is described in an article entitled "OUTPUT ESD PROTECTION TECHNIQUES FOR ADVANCED CMOS PROCESSES", C. Duvvury et al., 1988 EOS/ESD SYMPOSIUM PROCEEDINGS, pp. 206-211.

This article describes a buried n+ (BN+) diffusion output device structure for an output ESD protection circuit for advanced CMOS processes (specifically in dynamic random access memories—DRAMs). According to this article, the BN+ devices can be incorporated into both pull-up and pull-down output devices with adequate drive currents and no transconductance degradation. However, as the article points out, there might be a concern about the devices' hot electron reliability due to reduced channel length and possible extra trap centers introduced by the BN+ process.

Though the output circuit mentioned above provides reasonable ESD protection, its possible that inherent problems may not deem this structure as being desirable. The output ESD protection circuit of the present invention allows ESD protection equal to or greater than the voltage range of +8000/−2000 V for the HBM response (the Mil. Std. human body model [HBM] test model) as well as protection equal to or greater than the voltage range of +900/−700 V for the MM EIAJ response (the EIAJ machine model [MM] test model) due to its' unique and yet simplistic fabrication layout.

All publications cited herein are hereby incorporated by reference.

SUMMARY OF THE INVENTION

The basic component of the output ESD protection circuit of the present invention comprises a low resistance connected in series between an output pad and conventional active output pullup and pulldown drivers.

In a preferred embodiment a lateral bipolar device is connected in parallel to an n-channel pulldown with its source tied to a common potential (conventionally labeled as $V_{SS}$). The pullup device is also an active n-channel pullup device with its source tied to an operating potential (conventionally labeled as $V_{CC}$) Both drains of the two n-channel devices have n-well underneath the n+ diffusion in the area where metal contacts are formed to thereby prevent metal spiking to the substrate during an ESD event.

The preferred embodiment allows ESD protection equal to or greater than the voltage range of +8000/−2000 V for the HBM response (the Mil. Std. human body model [HBM] test model) as well as protection equal to or greater than the voltage range of +900/−700 V for the MM EIAJ response (the EIAJ machine model [MM] test model).

The fabrication layout of the preferred embodiment is presented as an output ESD protection circuit which is described hereinafter, however the concept of using a low resistance between a pad and associated active devices (i.e., ESD protection circuitry) will work in combination with other ESD protection circuitry layouts and work equally well for input pad ESD protection.

One embodiment of the present invention may be employed in a semiconductor device constructed on a substrate with the electrostatic discharge (ESD) protection structure comprising:

a series resistance connecting between a conductive pad and a conductive bus; and an ESD protection circuit electrically connected to said conductive bus.

This embodiment can be further characterized by any or all of the following:

1) The ESD protection circuit comprises a lateral n-p-n transistor;

2) The ESD protection structure comprises an ESD output protection structure further comprising pullup and pulldown output devices connected between a first and second potential, respectively, with their outputs connected to the conductive bus;

3) The pullup and pulldown output devices comprise active n-channel devices;

4) The ESD protection structure comprises an ESD input protection structure;

5) The semiconductor device comprises a dynamic random access memory device;

6) The substrate comprises silicon;

7) The series resistance has a value of approximately 5Ω;

8) The series resistance comprises a polysilicon resistor;

9) The series resistance comprises a silicided polysilicon resistor; and

10) The conductive pad and the conductive bus comprise metal.

Another embodiment of the present invention may be employed in a dynamic random access memory device constructed on a silicon substrate with the electrostatic discharge (ESD) protection structure comprising:

a series silicided polysilicon resistance connecting between a conductive output pad and a conductive bus;

a lateral n-p-n transistor ESD protection circuit electrically connected to the conductive bus; and active n-channel pullup and pulldown output devices connected between a first and second potential, respectively, with their outputs connected to the conductive bus.

This embodiment can be further characterized by any or all of the following:

1) The series resistance has a value of approximately 5Ω; and

2) The conductive pad and the conductive bus comprise metal.

DETAILED DESCRIPTION OF THE PREFERRED EMBODIMENTS

The present invention, as depicted in FIGS. 1-6, has been fabricated and tested in a dynamic random access memory device and is described hereinafter for sake of illustration.

Figure 1:
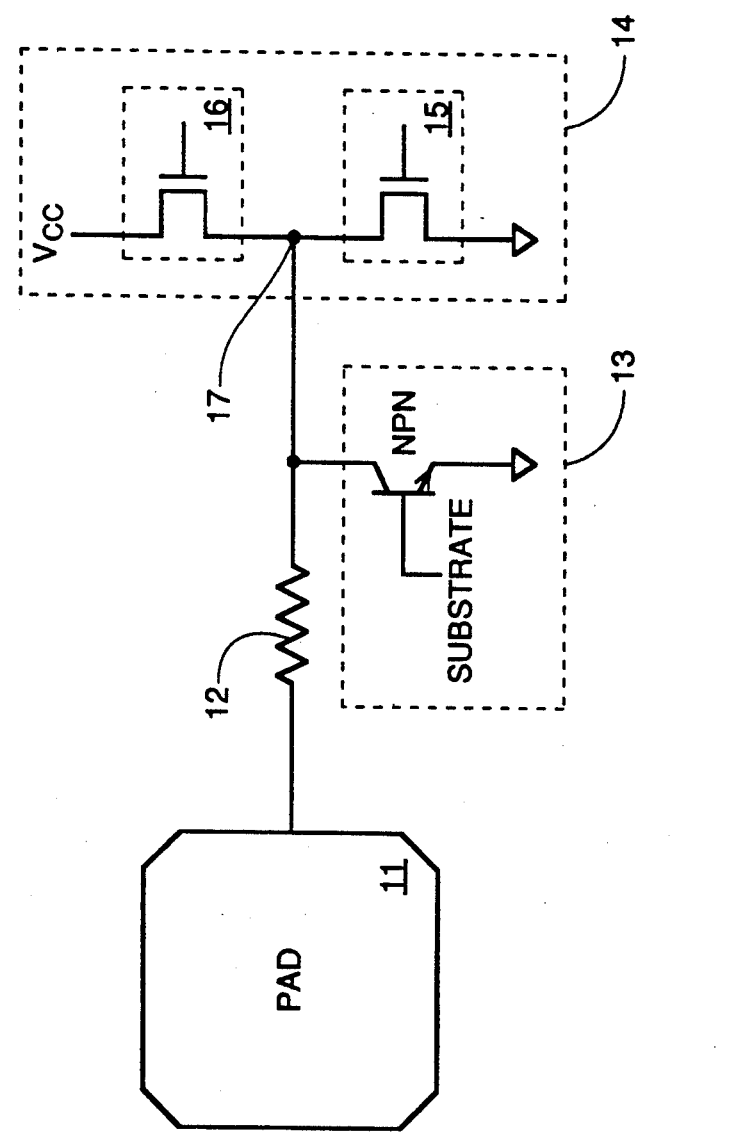
FIG. 1 depicts a schematical representation of the present invention.

Referring now FIG. 1, series resistor 12 is shown connected between input pad 11 and active output driver circuit 14. Lateral n-p-n bipolar transistor 13 connects between the output node of circuit 14 and $V_{SS}$. This is accomplished by its collector being connected to output node 17 as well as to resistor 12, its emitter being connected to $V_{SS}$ and its gate being connected to the silicon substrate of the semiconductor device. Output driver circuit 14 comprises active pullup n-channel transistor 16 and active n-channel transistor 15 connected together by their drains at output node 17. As will be further pointed out in a cross-sectional view following, an n-well resides underneath the metal contacts made at the output node 17. Lastly, the sources of transistors 16 and 15 are connected between $V_{CC}$ and $V_{SS}$, respectively.

Figure 2:
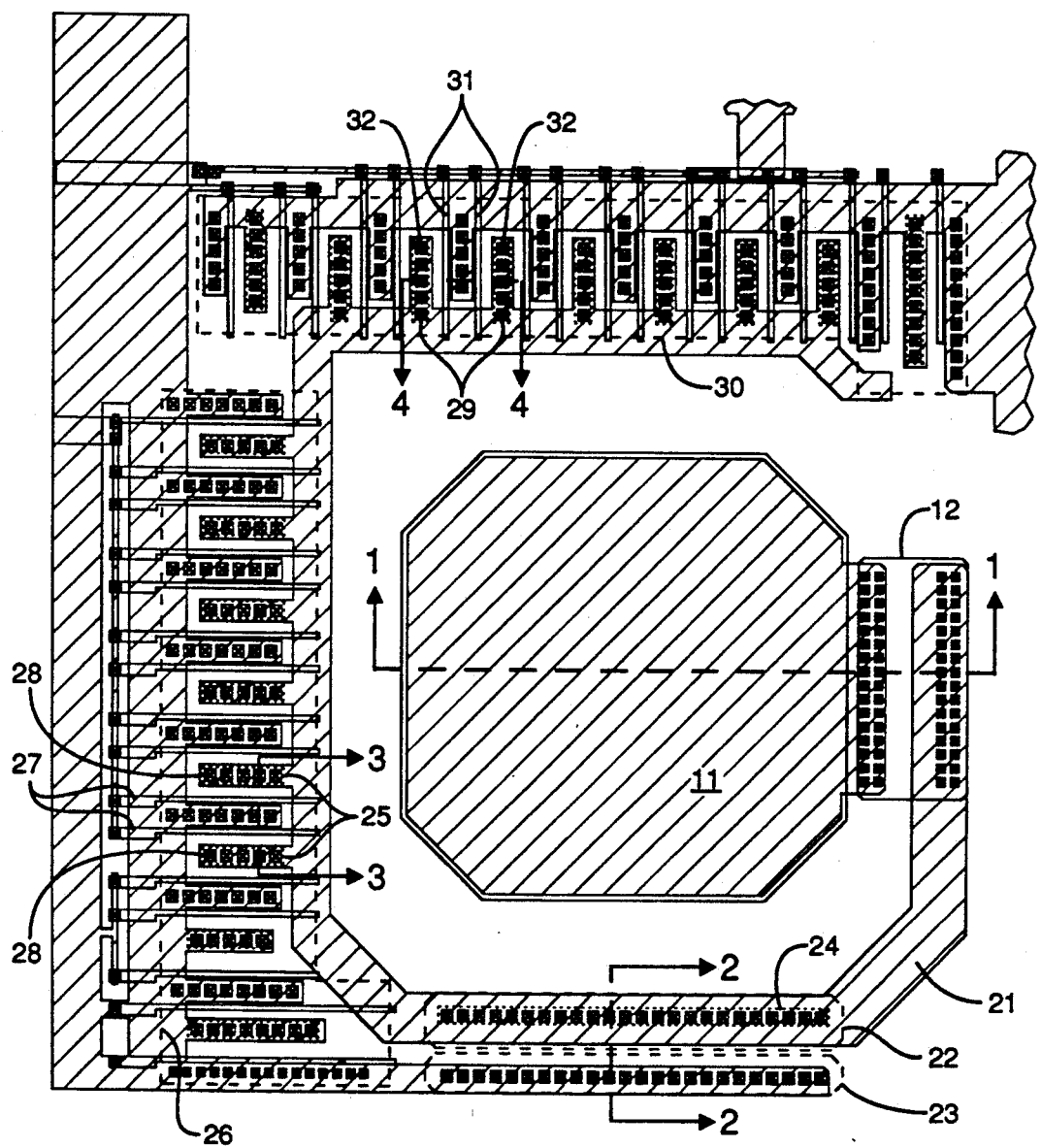
FIG. 2 depicts a top view fabrication layout of the present invention.

Referring now to the top layout view of FIG. 2, metal input pad 11 is shown connected by metal contacts to a resistor 12, preferably of polysilicon or silicided polysilicon. Resistor 12 bridges between metal bus 21 and pad 11, while being connected thereto by metal contacts. The layout of metal bus 21 is shown as surrounding metal pad 11 (though this layout is preferred but not required) and passing over various structures that will be more fully discussed in the cross-sectional views to follow. Metal bus 21 passes over and connects to n+ diffusion area 22 via metal contacts while all metal contacts made between n+ diffusion area 22 and metal bus 21 having an underlying n-well region 24. A second n+ diffusion area 23, connected to $V_{SS}$, runs parallel to n+ area 22. Next, metal bus 21 connects to a string of pulldown transistors via metal contacts 28. The pulldown transistors are made of n+ active areas 26 (source/drain regions) and polysilicon gates 27. All metal contacts 28, made between n+ diffusion area 26 and metal bus 21 have an underlying n-well region 25. And finally, metal bus 21 connects to a string of pullup transistors via metal contacts 32. The pullup transistors are made of n+ active areas 30 (source/drain regions) and polysilicon gates 31. All metal contacts 32, made between n+ diffusion area 30 and metal bus 21 have an underlying n-well region 29.

Figure 3:
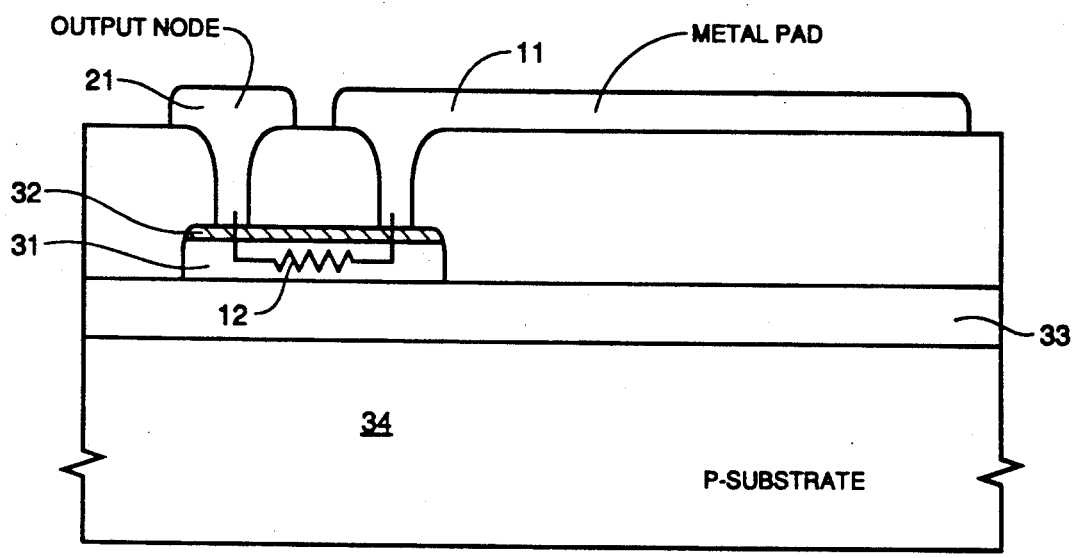
FIG. 3 depicts a composite cross-sectional view taken through line 1—1 of FIG. 2, featuring a low resistance series polysilicon resistor connected between the pad and active output drivers.

Referring now to FIG. 3 (a cross-sectional view taken through line 1—1 of FIG. 2), resistor 12 is shown connecting between metal bus 21 and metal input pad 11. Resistor 12 is a low resistance (approximately in the 5Ω range) preferably made up of a layer of conductively doped polysilicon 31 and a layer of silicide 32, however a conductively doped polysilicon resistor would suffice as would other appropriate materials. Resistor 12, metal bus 21 and metal pad 11 are separated from the underlying substrate by an insulating layer 33. Series resistor 12 allows for enhanced ESD protection as it provides good protection to the output pullup and pulldown transistors by attenuating the voltage waveform resulting from an ESD event and thereby reduces the amount of energy dissipated upon these transistors. In fact, out experiments have shown that this series polysilicon resistor works equally as well in conjunction with input pad ESD protection circuitry. Referring back to FIG. 2, the series polysilicon resistor is made with a double row of metal contacts on both sides of the resistor. Also, the polysilicon resistor is very wide (approximately 60μ's wide) and the two nodes are separated by approximately 15μ's. This layout results in a very rugged polysilicon resistor that can withstand large ESD voltages.

Figure 4:
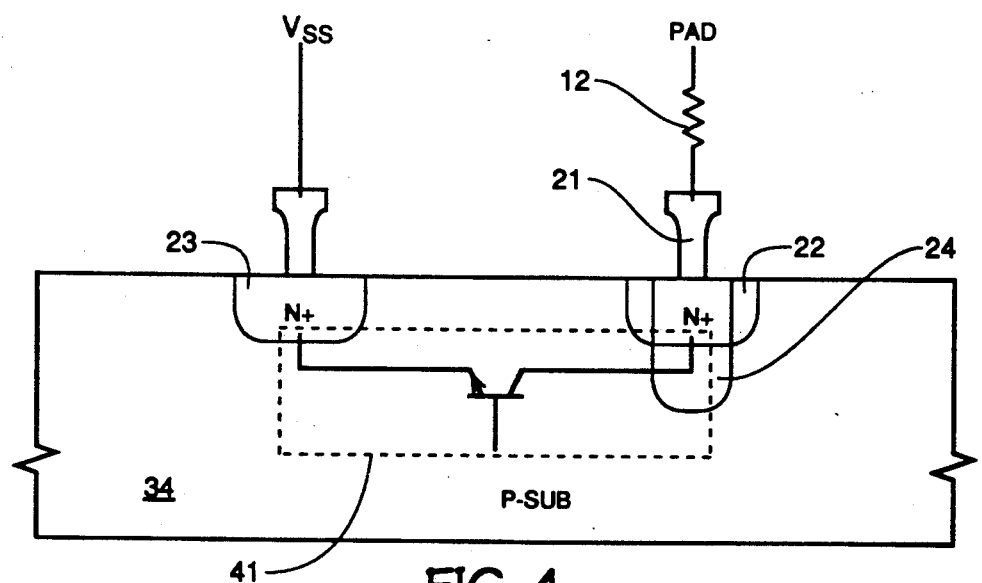
FIG. 4 depicts a composite cross-sectional view taken through line 2—2 of FIG. 2, featuring a lateral n-p-n transistor connected to the output node.

Referring now to FIG. 4 (a cross-sectional view taken through line 2—2 of FIG. 2), a lateral n-p-n transistor 41 which provides additional protection against stress voltages, is shown schematically to illustrate the transistor structure that results from the following device fabrication layout. N+ diffusion areas 22 and 23 are formed in p-substrate 34. The contacts between metal bus 21 and N+ diffusion areas 22 have an underlying n-well 24. From the arrangement of diffusion areas 22 and 23 and the underlying p-type substrate 34, the lateral n-p-n transistor is formed with its base at the p-type substrate, its emitter at n+ area 23 and its collector at n+ area 22.

Figure 5:
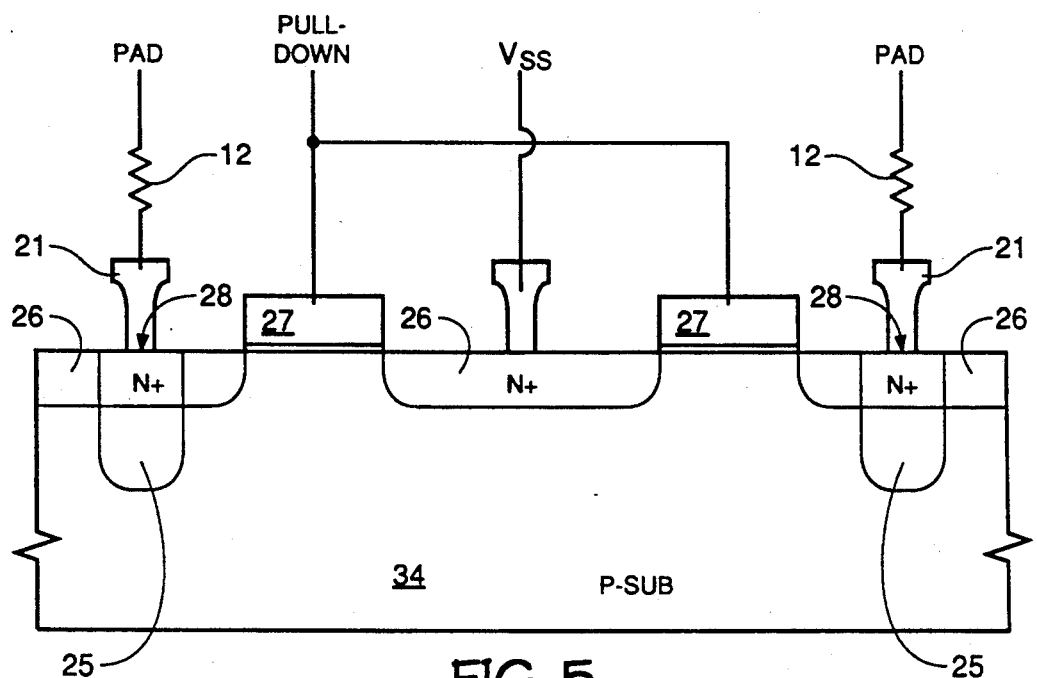
FIG. 5 depicts a composite cross-sectional view taken through line 3—3 of FIG. 2, featuring active n-channel pulldown devices.

Referring now to FIG. 5 (a cross-sectional view taken through line 3—3 of FIG. 2), output pulldown devices are shown. N-channel output pulldown devices are formed from n+ active areas 26 embedded in p-substrate 34. Polysilicon gates 27 bridge between the separate n+ active areas 26 and thereby complete the active pulldown transistors. The source of each transistor is connected to $V_{SS}$ while each drain is connected to metal bus 21. All metal contacts 28, made between n+ diffusion area 26 and metal bus 21 have an underlying n-well region 25.

Figure 6:
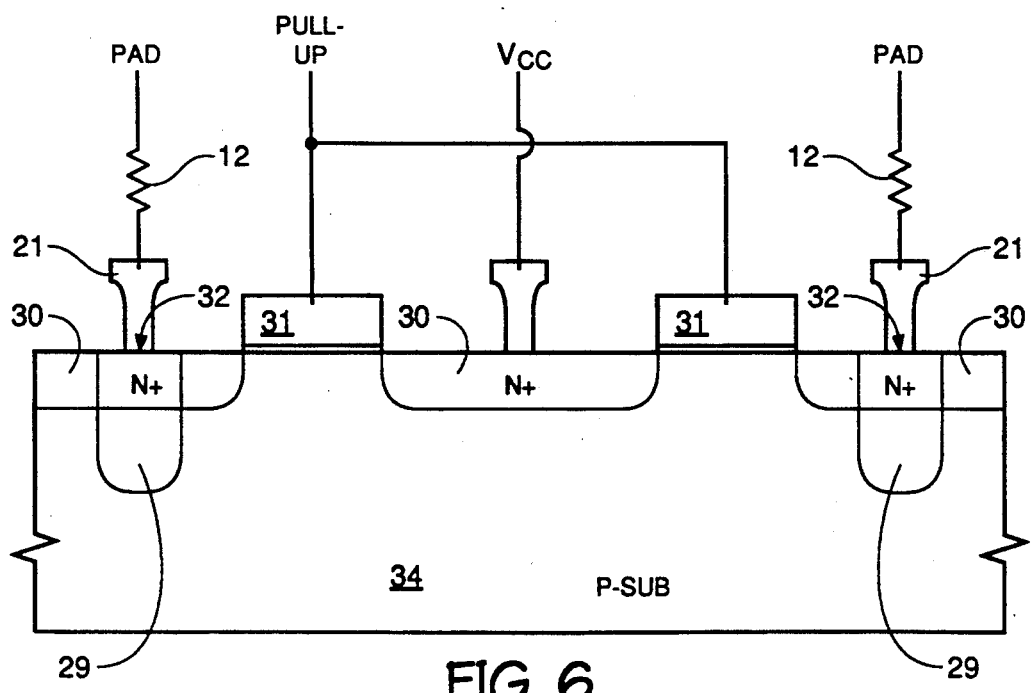
FIG. 6 depicts a composite cross-sectional view taken through line 4—4 of FIG. 2, featuring active n-channel pullup devices.

Referring now to FIG. 6 (a cross-sectional view taken through line 4—4 of FIG. 2), output pullup devices are shown. N-channel output pullup devices are formed from n+ active areas 30 embedded in p-substrate 34. Polysilicon gates 31 bridge between the separate n+ active areas 30 and thereby complete the active pullup transistors. The source of each transistor is connected to $V_{CC}$ while each drain is connected to metal bus 21. All metal contacts 32, made between n+ diffusion area 30 and metal bus 21 have an underlying n-well region 29.

Also, as seen in FIGS. 4-6, all metal contacts to a diffusion region (n+ in each case) connected to metal bus 21 have underlying n-well regions which in effect increase the depth of the contacts' underlying diffusion area. This increase in diffusion depth provides greater protection to the contact areas during an ESD event than do conventional fabrication layouts in that, as is expected, the metal contacts are also prone to receiving damage during an ESD event as the electric field developed at the metal/diffusion area junction may be sufficient enough to penetrate into the substrate and allow the large surge of current to short the contact junction to the substrate. By increasing the diffusion depth underlying the contact junction, the ESD caused electric field now has a greater depth for the voltage to be dropped thereby protecting the contact junction from damage.

It is to be understood that although the present invention has been described in a preferred embodiment, various modifications known to those skilled in the art may be made without departing from the invention as recited in the several claims appended hereto. For example, the present invention is described in view of its implementation into a DRAM device, however any semiconductor device constructed from a CMOS process would enhance its output or input ESD protection capability by integrating the present invention into the fabrication layout. Also, it is conceivable that one skilled in the art may choose to integrate the series polysilicon resistor with an existing ESD protection circuit without departing from the claimed invention.

I claim:

1. An electrostatic discharge (ESD) protection structure for a semiconductor device constructed on a substrate comprising:
    a series resistance connecting between a conductive pad and a conductive bus;
    a lateral n-p-n transistor ESD protection circuit electrically connected to said conductive bus; and
    an ESD output protection structure comprising active n-channel pullup and pulldown output devices connected between a first and second potential, respectively, with their outputs connected to said conductive bus.

2. The electrostatic discharge (ESD) protection structure of claim 1 wherein said substrate comprises a silicon substrate.

3. The electrostatic discharge (ESD) protection structure of claim 1 wherein said series resistance has a value of approximately 5Ω.

4. The electrostatic discharge (ESD) protection structure of claim 1 wherein said series resistance comprises a polysilicon resistor.

5. The electrostatic discharge (ESD) protection structure of claim 1 wherein said series resistance comprises a silicided polysilicon resistor.

6. The electrostatic discharge (ESD) protection structure of claim 1 wherein said conductive pad and said conductive bus comprise metal.

7. An electrostatic discharge (ESD) output protection circuit for a dynamic random access memory semiconductor device constructed on a silicon substrate comprising:
    a series silicided polysilicon resistance connecting between a conductive output pad and a conductive bus;
    a lateral n-p-n transistor ESD protection circuit electrically connected to said conductive bus; and
    active n-channel pullup and pulldown output devices connected between a first and second potential, respectively, with their outputs connected to said conductive bus.

8. The electrostatic discharge (ESD) protection structure of claim 7 wherein said series resistance has a value of approximately 5Ω.

9. The electrostatic discharge (ESD) protection structure of claim 7 wherein said conductive pad and said conductive bus comprise metal.

10. An electrostatic discharge (ESD) protection structure constructed on a substrate comprising:
    a series resistance connecting between a conductive pad and a conductive bus;
    a lateral n-p-n transistor ESD protection circuit electrically connected to said conductive bus; and
    an ESD output protection structure comprising active n-channel pullup and pulldown output devices connected between a first and second potential, respectively, with their outputs connected to said conductive bus.

11. The electrostatic discharge (ESD) protection structure of claim 10 wherein said substrate comprises a silicon substrate.

12. The electrostatic discharge (ESD) protection structure of claim 10 wherein said series resistance has a value of approximately 5Ω.

13. The electrostatic discharge (ESD) protection structure of claim 10 wherein said series resistance comprises a polysilicon resistor.

14. The electrostatic discharge (ESD) protection structure of claim 10 wherein said series resistance comprises a silicided polysilicon resistor.

15. The electrostatic discharge (ESD) protection structure of claim 10 wherein said conductive pad and said conductive bus comprise metal.

16. An electrostatic discharge (ESD) output protection circuit constructed on a silicon substrate comprising:
    a series silicided polysilicon resistance connecting between a conductive output pad and a conductive bus;
    a lateral n-p-n transistor ESD protection circuit electrically connected to said conducive bus; and
    active n-channel pullup and pulldown output devices connected between a first and second potential, respectively, with their outputs connected to said conductive bus.

17. The electrostatic discharge (ESD) protection structure of claim 16 wherein said series resistance has a value of approximately 5Ω.

18. The electrostatic discharge (ESD) protection structure of claim 16 wherein said conductive pad and said conductive bus comprise metal.

* * * * *